United States Patent [19]
Saito et al.

[11] Patent Number: 5,449,637
[45] Date of Patent: Sep. 12, 1995

[54] METHOD OF PRODUCING LOW AND HIGH VOLTAGE MOSFETS WITH REDUCED MASKING STEPS

[75] Inventors: Yutaka Saito; Yoshikazu Kojima; Kazutoshi Ishii, all of Tokyo, Japan

[73] Assignee: Seiko Instruments, Inc., Japan

[21] Appl. No.: 128,059

[22] Filed: Sep. 27, 1993

Related U.S. Application Data

[63] Continuation of Ser. No. 880,723, May 8, 1992, abandoned.

[30] Foreign Application Priority Data

May 8, 1991 [JP] Japan .................................. 3-102879
May 17, 1991 [JP] Japan .................................. 3-113543

[51] Int. Cl.6 ........................................ H01L 21/8238
[52] U.S. Cl. .................................. 437/57; 437/34; 437/147
[58] Field of Search .............. 148/DIG. 9, DIG. 112, 148/DIG. 114; 437/34, 56, 57, 58, 70, 147, 238, 243

[56] References Cited

U.S. PATENT DOCUMENTS

| | | | |
|---|---|---|---|
| 4,468,852 | 9/1984 | Cerofolini | 437/57 |
| 4,558,508 | 12/1985 | Kinney et al. | 437/34 |
| 4,628,341 | 12/1986 | Thomas | 148/DIG. 9 |
| 4,902,634 | 2/1990 | Picco | 437/34 |
| 5,130,271 | 7/1992 | Migita | 437/147 |

FOREIGN PATENT DOCUMENTS

| | | | |
|---|---|---|---|
| 0275508 | 7/1988 | European Pat. Off. | 437/34 |
| 0133920 | 5/1990 | Japan | 437/57 |

Primary Examiner—Chandra Chaudhari
Attorney, Agent, or Firm—Adams & Wilks

[57] ABSTRACT

An electroconductive or insulative film 100 is formed over a surface of a semiconductor substrate 1. A first photoresist 101 is coated over the film 100, and is then patterned. The film 100 is selectively removed by etching to expose a given area of the substrate 1. Subsequently an impurity of the first conductivity type is doped into the exposed area to form a first impurity region. After removing the first photoresist 101, a second photoresist 103 is coated entirely over the film 100, and is then patterned. Subsequently, the film 100 is selectively removed from another given area by etching. Another impurity of the second conductivity type is doped into the exposed area to form a second impurity region 104. Only the two steps of the photoresist patterning are carried out to form the impurity regions of the different conductivity types, thereby reducing production cost of the semiconductor device. The impurity can be doped by ion implantation while covering the film 100 with the photoresist, thereby facilitating micronization and integration of the semiconductor device.

7 Claims, 19 Drawing Sheets

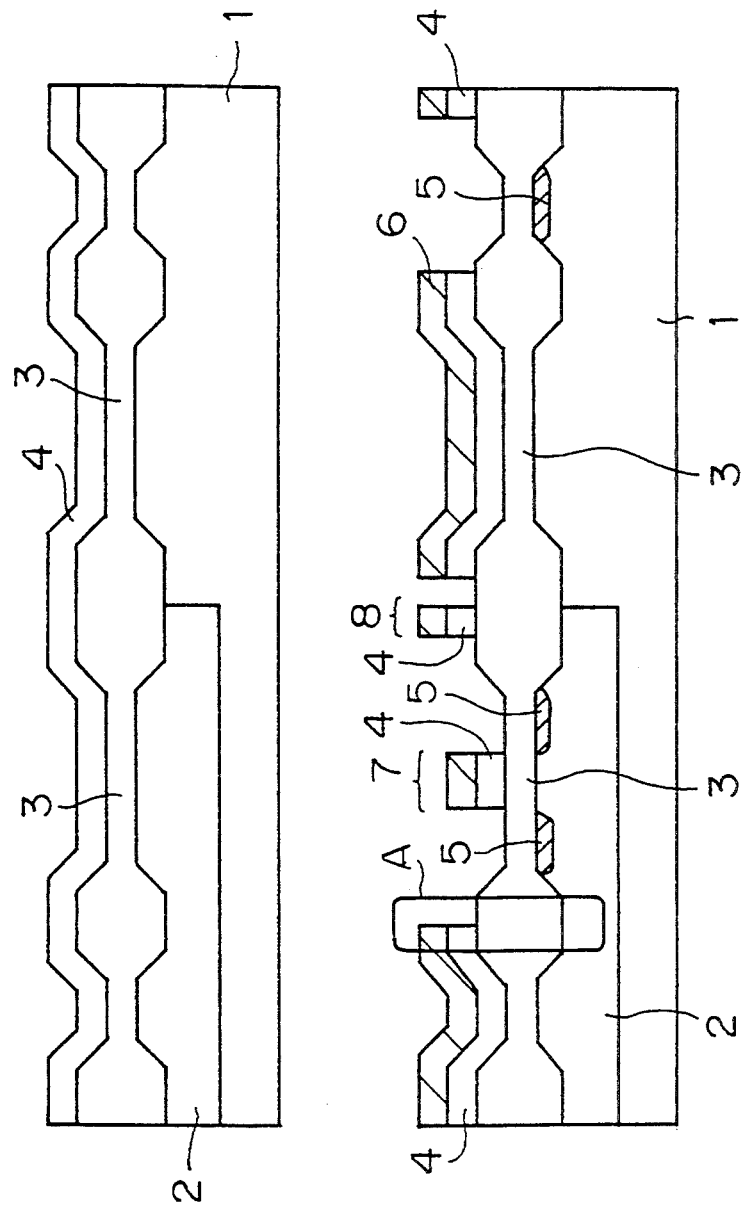

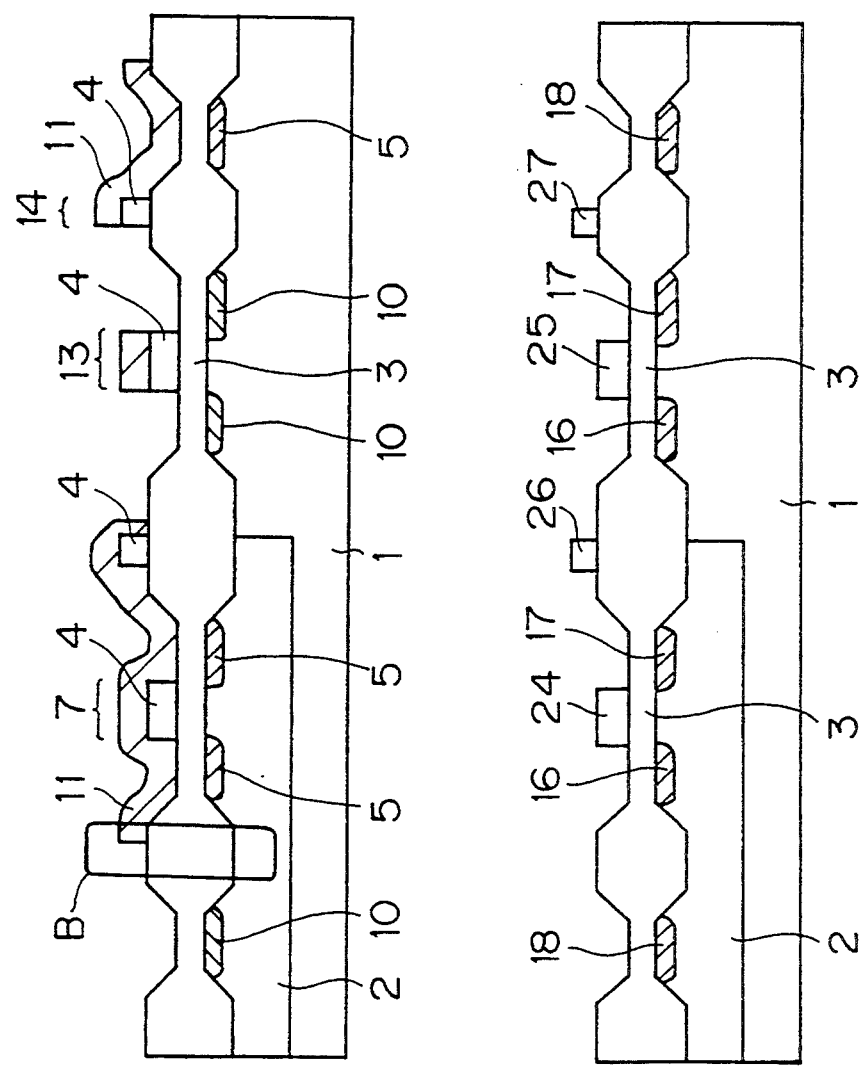

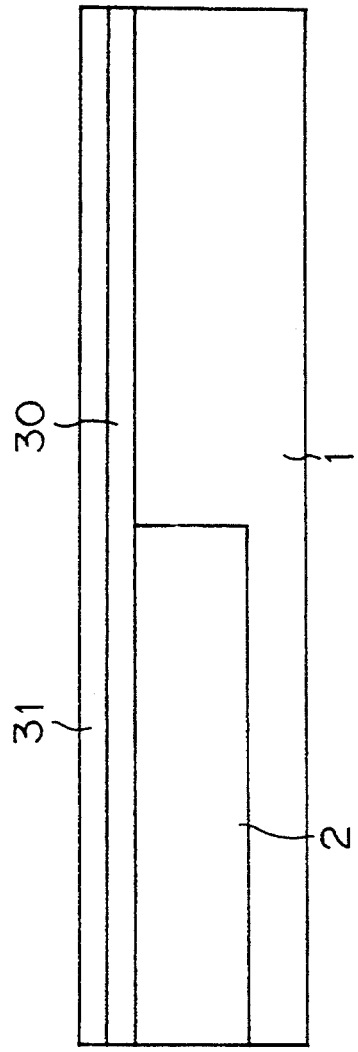
F I G. 8 (a)
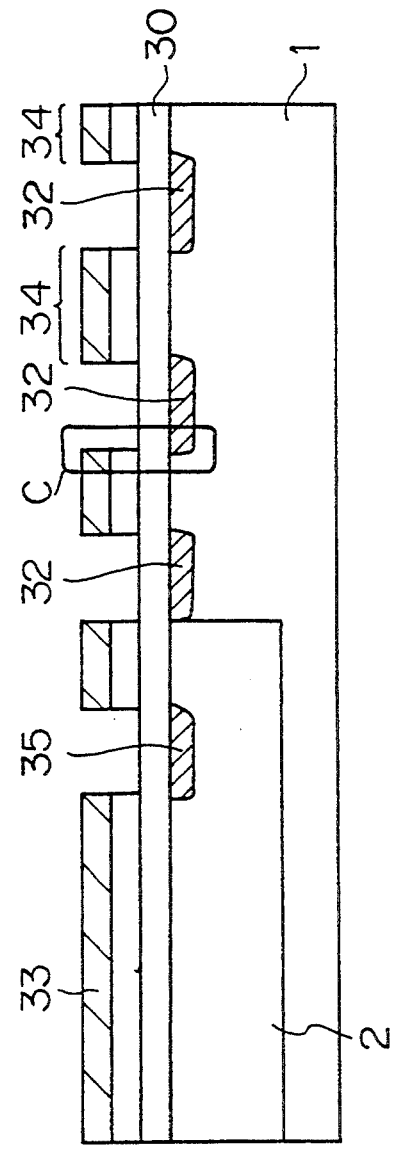
F I G. 8 (b)

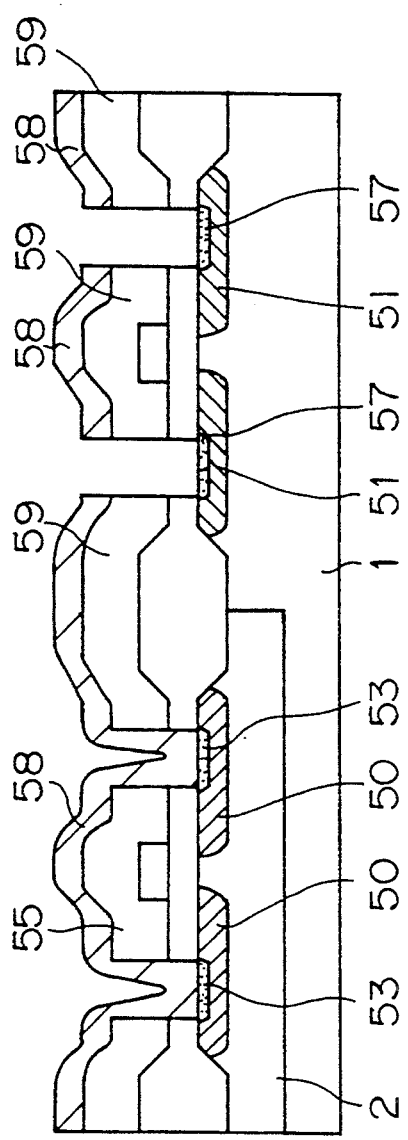
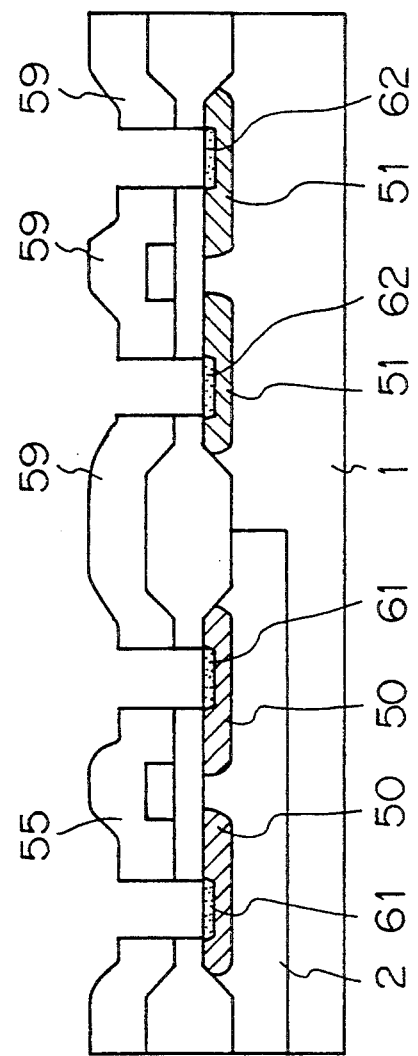
FIG.14(a)
FIG.14(b)

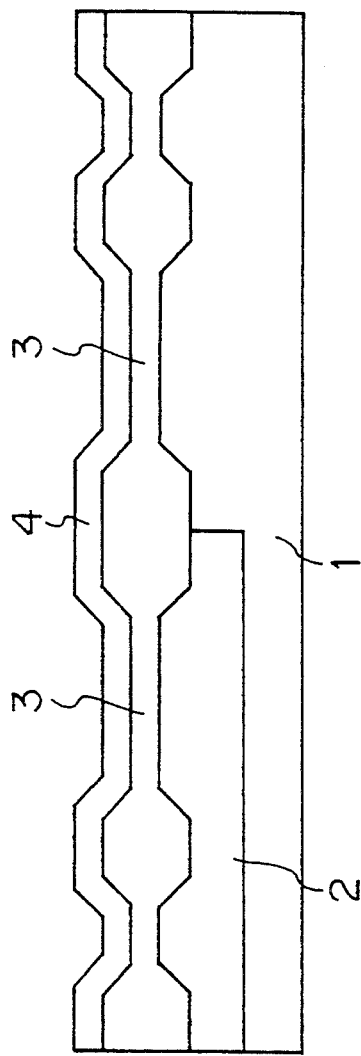
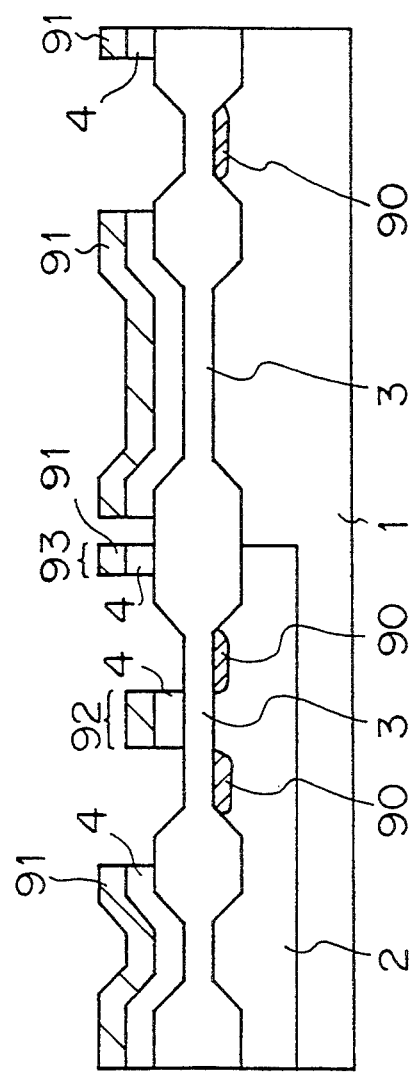
F I G. 15(a)
F I G. 15(b)

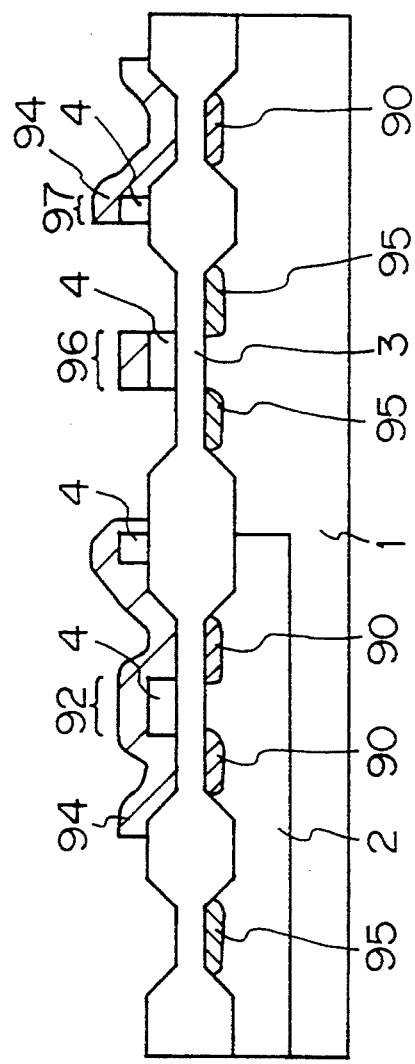
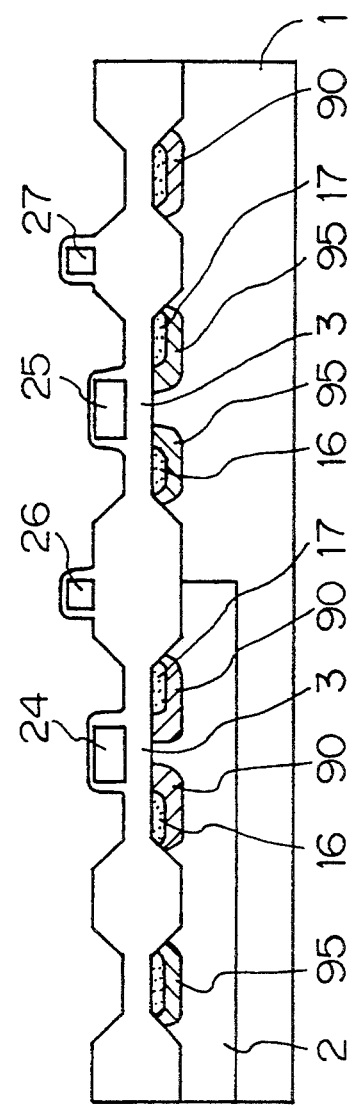
FIG. 16(a)
FIG. 16(b)

METHOD OF PRODUCING LOW AND HIGH VOLTAGE MOSFETS WITH REDUCED MASKING STEPS

This is a continuation of application Ser. No. 07/880,723, filed May 8, 1992 now abandoned.

BACKGROUND OF THE INVENTION

The present invention relates to a method of forming an impurity region in a semiconductor device such as a CMOS type semiconductor integrated circuit device.

FIGS. 17(a)–17(c) and FIGS. 18(a), 18(b) are a process step diagram of a first prior art method of forming a source drain impurity region in the CMOS type semiconductor integrated circuit device. A gate electrode film 203 is formed on a surface of a semiconductor substrate 201 of a first conductivity type and on a surface of a well 202 of a second conductivity type opposite to the first conductivity type, in superposed relation to an underlying gate insulating film (FIG. 17(a)). Thereafter, a pair of gate electrodes 204 and 205 are concurrently patterned, respectively, on a first area into which the first conductivity type impurity is to be doped and on a second area into which the second conductivity type impurity is to be doped, by a first patterning process using a resist film 206. The unmasked remaining portion of the gate electrode film 203 is removed by etching process (FIG. 17(b)). Then, the second area into which the second conductivity type impurity is to be doped is masked by a second patterning process using a resist film 207. Subsequently the first conductivity type impurity is doped into the first area in in self-alignment manner through the gate electrode 204 to form a source drain impurity region 209 (FIG. 17(c)). In a similar manner, the first area is then masked by a third patterning process, and the second conductivity type impurity is doped into the second area to form another source drain impurity region 210 (FIG. 18(a)). Thus, a pair of two different conductivity types of transistors are formed as a CMOS pair (FIG. 18(b)).

FIGS. 19(a)–19(e) are a process step diagram of a second prior art method of forming an impurity region for device isolation in the CMOS type semiconductor integrated circuit device. A nitride film 211 is formed as an anti-oxidation film on a semiconductor substrate 201 of the first conductivity type and on a well 202 of the second conductivity type opposite to the first conductivity type, in superposed relation to an underlying pad oxide film (FIG. 19(a)). Thereafter, the nitride film 211 is selectively masked by a first patterning process using a photoresist film 214 over a first conductivity type device region 212 and over a second conductivity type device region 213. Then, the remaining unmasked portion of the nitride film 211 is removed by etching (FIG. 19(b)). After removing the photoresist 214, the second conductivity type device region 213 is masked by a second patterning process using a photoresist 215. Subsequently, a first conductivity type impurity is doped around the first device region 212 in self-alignment manner (FIG. 19(c)). In a similar manner, the first device region 212 is masked by a third patterning process, and a second conductivity type impurity is doped around the second device region 213 (FIG. 19(d)). By such a process, a pair of impurity regions 216, 217 are formed for device isolation of two different conductivity types of transistors which constitute a CMOS pair (FIG. 19(e)).

FIGS. 20(a), 20(b) and FIGS. 21(a)–21(c) are a process step diagram of a third prior art method of forming an impurity region for an electrical contact with a metal lead in the CMOS type semiconductor integrated circuit device. An insulating film 220 is formed over a surface of a semiconductor substrate 201 of the first conductivity type and over a surface of an impurity-doped well 202 of the second conductivity type opposite to the first conductivity type, so as to cover a first conductivity impurity region 218 which defines a source drain region and to cover a second conductivity impurity region 219 which defines another source drain region (FIG. 20(a)). Thereafter, the insulating film 220 is selectively masked by a first patterning process using a photoresist 223 to define a first inter-layer insulating section 221 and a second inter-layer insulating section 222. Then, the unmasked portion of the insulating film 220 is removed by etching to form contact holes (FIG. 20(b)). Then, after removing the photoresist 223, the second inter-layer insulating section 222 is selectively masked by a second patterning process using a photoresist 224, while a first conductivity type impurity is doped in self-alignment manner through the other inter-layer insulating section 221 to form high impurity density regions 225 in the source drain region 218 (FIG. 21(a)). In a similar manner, the first inter-layer insulating section 221 is masked by a third patterning process, while a second conductivity type impurity is doped to form other high impurity density regions 226 (FIG. 21(b)). By such processings, the two conductivity types of impurity regions 225, 226 are formed correspondingly to a CMOS pair of two different conductivity types of transistors so as to reduce an electric contact resistance to a metal lead pattern (not shown).

In the first prior art fabrication process, the gate electrode film such as a polysilicon film is etched through the first patterning process to form a pair of gate electrodes. Thereafter, the first area is selectively exposed by the second patterning process so as to dope the first conductivity type impurity to form the first impurity region. Subsequently, the second area is selectively exposed by the third patterning process so as to dope the second conductivity type impurity to form the second impurity region. In the second prior art fabrication process, the nitride film is selectively etched through the first patterning process to cover a pair of device regions. Thereafter, the second patterning process is carried out to selectively expose a surrounding area of the first device region so as to dope the first conductivity type impurity to form the first device isolation region. Lastly, the third patterning process is carried out to selectively expose another surrounding area of the second device region so as to dope the second conductivity type impurity to form the second device isolation region. In the third prior art doping method, the insulating film is etched selectively through the first patterning process to form contact holes which communicate with the source drain regions. The second patterning process is carried out to selectively open a first group of the contact holes so as to dope the first conductivity type impurity to form the first high impurity density region effective to reduce a contact resistance. Lastly, the third patterning process is carried out to selectively open a second group of the contact holes so as to dope the second conductivity type impurity to form the second high impurity density region effective to reduce a contact resistance. In these prior art doping methods, at least three steps of patterning are required in order to dope two different conductivity types of impurities.

SUMMARY OF THE INVENTION

In view of the above noted drawbacks of the prior art, an object of the invention is to reduce the number of patterning process steps in selective doping of the opposite conductivity types of impurities. In a first aspect of the present invention, a source drain impurity region is formed in a CMOS type semiconductor integrated circuit device by the following steps. Namely, a gate electrode and a lead electrode are patterned and etched through a first photoresist on a first device region. Thereafter, a first conductivity type impurity is doped into the first device region while leaving the first photoresist. Then, another gate electrode and another lead electrode are patterned and etched through a second photoresist on a second device region. While reserving the second photoresist, a second conductivity type impurity is doped into the second device region. In a second aspect of the present invention, a device isolation impurity region is formed in a CMOS type semiconductor integrated circuit device by the following steps. Namely, a nitride film of an oxidation mask is selectively etched and patterned by means of a first photoresist to cover or mask a first device region and to expose a surrounding device isolation region around the first device region. Subsequently a first conductivity type impurity is doped into the exposed isolation region. Then, the nitride film of the oxidation mask is again selectively etched and patterned by means of a second photoresist to cover or mask a second device region and to expose another surrounding device isolation region around the second device region. Subsequently, a second conductivity type impurity is doped into succeedingly exposed device isolation region. In a third aspect of the invention, a contact impurity region is formed in the CMOS type semiconductor integrated circuit device by the following steps. Namely, an overlaying insulating film is selectively etched and patterned through a first photoresist to form a contact hole on a first source drain region, and subsequently a first conductivity type impurity is doped into the first source drain region to form a first contact impurity region. Thereafter, the overlaying insulating film is again selectively etched and patterned through a second photoresist to form another contact hole on a second source drain region, and subsequently a second conductivity type impurity is doped into the second source drain region to form a second contact impurity region.

Accordingly to the first aspect of the invention, one of the patterning photoresist steps can be elimiminated as compared to the first prior art method in forming source drain pairs of opposite conductivity types. According to the second aspect of the invention, one of the patterning photoresist steps can be saved as compared to the second prior art method in forming device regions of opposite conductivity types. According to the third aspect of the invention, one of the patterning photoresist steps can be saved as compared to the third prior art method in forming the contact impurity regions of opposite conductivity types. Further, in the case where the impurity is doped by ion implantation to form the source drain impurity region in self-alignment manner through the patterned gate electrode, the impurity ions can be introduced while the gate electrode is covered with a photoresist. Moreover, in the case where the impurity is doped by ion implantation to form the device isolation region during the course of LOCOS process in self-alignment manner through the patterned nitride film of the oxidation mask, the impurity ions can be introduced into the device isolation region while the overlaying photomask is left on the patterned nitride film.

BRIEF DESCRIPTION OF THE DRAWINGS

FIGS. 2(a) and 2(b) are a process step diagram showing a second embodiment of the invention;

FIGS. 3(a) and 3(b) are a process step diagram showing a second embodiment of the invention;

FIGS. 8(a) and 8(b) are a process step diagram showing a fourth embodiment of the invention;

FIGS. 14(a) and 14(b) are a process step diagram showing a sixth embodiment of the invention;

FIGS. 15(a) and 15(b) are a process step diagram showing a seventh embodiment of the invention;

FIGS. 16(a) and 16(b) are a process step diagram showing a seventh embodiment of the invention;

DETAILED DESCRIPTION OF THE INVENTION

Figure 1A:
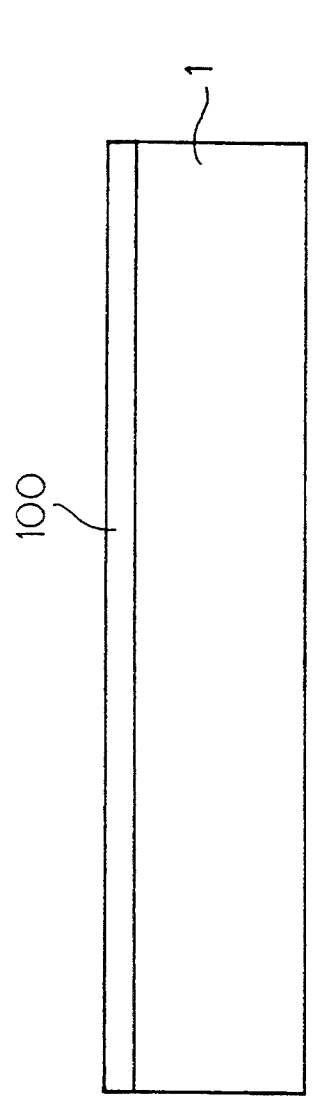
FIGS. 1(a)–1(c) are a process step diagram showing a first embodiment of the invention.
Figure 1B:
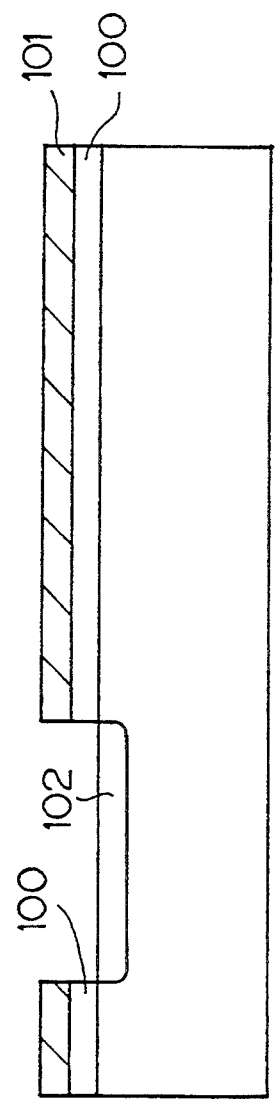
Figure 1C:
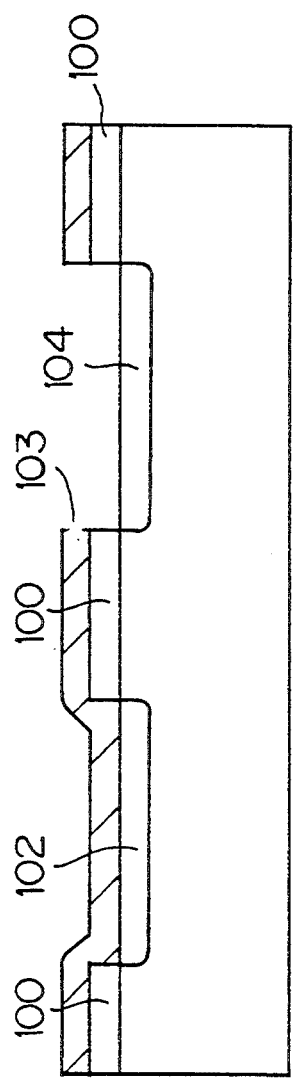

Hereinafter, the present invention will be described in detail with reference to the drawings. FIGS. 1(a)– 1(c) are a process step diagram showing a first embodiment of the inventive method in which a pair of impurity regions of different conductivity types are formed in a semiconductor device. A solid film 100 (an electroconductive or semiconductive or insulative film) is formed over a semiconductor substrate 1 (FIG. 1(a)). A photoresist 101 is applied over the solid film 100. The photoresist 101 is patterned such that a predetermined section of the photoresist 101 is selectively removed by photolithography. Then, an exposed part of the solid film 100 is removed by etching. Subsequently, a first conductivity type impurity is doped into an exposed area of the semiconductor substrate 1 to form a first impurity region 102 (FIG. 1(b)). Next, after removing the photoresist 101, a new photoresist 103 is coated entirely and is then selectively patterned to expose another section of the solid film 100. The exposed film 100 is removed by etching to expose another surface area of the substrate 1, separated from the first impurity region 102. Then, a second conductivity type impurity is doped into the newly exposed area to form a second impurity region 104 (FIG. 1(c)). During the course of the second impurity doping, the precedingly formed first impurity region 102 is masked by the succeedingly applied photoresist 103 in order to avoid duplicative doping of the different conductivity type impurities. By such processings, the pair of impurity regions 102, 104 of the different conductivity types are formed by only two masking steps or photoresist patterning steps. Particularly in the case where ion implantation is adopted for the impurity doping, impurity ions are irradiated through a double layer of the photoresist film and the solid film 100 so that the impurity ions are well blocked as compared to the prior art in which a surface of the semiconductor substrate is masked by a single layer of the conductive or insulative film.

FIGS. 2(a), 2(b) and FIGS. 3(a), 3(b) are a process step diagram showing a second embodiment of the inventive method in which a source drain impurity region, a lead impurity region, a resistor impurity region, a gate electrode and a polysilicon lead electrode are formed in a CMOS type semiconductor integrated circuit device. An electroconductive polysilicon film 4 is formed over an underlying gate insulating film 3 so as to cover a surface of a semiconductor substrate 1 of the first conductivity type and a surface of a well 2 of the second conductivity type (FIG. 2(a)). Next, a photoresist 6 is applied over the polysilicon film 4, and is then selectively patterned to cover a first gate electrode area 7, a first lead electrode area 8 and the remaining area except for a first active area 5 surrounding the first gate electrode area 7 and except along a given pattern area. Thereafter, the polysilicon film 4 is selectively etched through the patterned photoresist 6 to expose the first active area 5. Concurrently, the polysilicon film 4 is left over the first gate electrode area 7 and the first lead electrode area 8. Then, a first conductivity type impurity is doped into the first active area 5 in self-alignment manner through the mask of the patterned photoresist 6 and polysilicon film 4 to form a corresponding first conductivity type impurity region (5) (FIG. 2(b)). After removing the old photoresist 6, a new photoresist 11 is applied over the substrate 1, and is then selectively patterned to cover a second gate electrode area 13 and a second lead electrode area 14 and the remaining surface area except for a second active area 10. Then, the polysilicon film 4 is etched selectively through the patterned photoresist 11 to expose the second active area 10. At the same time, the polysilicon film 4 is left on the second gate electrode area 13 and the second lead electrode area 14. Subsequently a second conductivity type impurity is doped into the exposed second active area 10 around the second gate electrode area 13 and along a predetermined second pattern area, thereby forming a corresponding second impurity region (10) of the second conductivity type (FIG. 3(a)). After removing the photoresist 11, there are obtained a CMOS pair of transistors of different conductivity types. One transistor formed in the well 2 has a first gate electrode 24 and a first lead electrode 26 composed of the precedingly patterned part of the polysilicon film 4 and a source region 16 and drain region 17 composed of the first conductivity type impurity region. The other transistor formed in the surface of the substrate 1 has a second gate electrode 25 and a second lead electrode 27 composed of the succeedingly patterned part of the polysilicon film 4, and another pair of source region 16 and drain region 17 composed of the second conductivity type impurity region. The remaining part of the impurity regions constitutes a lead pattern region resistive element region 18 (FIG. 3(b)). In this second embodiment of the invention, the source drain region and the gate electrode of the CMOS pair of transistors can be formed by a reduced number of photoresist film patterning process steps.

In this second embodiment, the first gate electrode area 7 and the second gate electrode area 13 are formed in separate patterning process steps. Therefore, they can be etched under different conditions. Namely, the first and second gate electrodes 24, 25 can be shaped in different dimensions using the same design mask dimension, thereby facilitating micronization of the transistors. The second embodiment is particularly effective where the impurity is doped by ion implantation obliquely at an incident angle over 3 degrees relative to the normal of the substrate so as to form the source region 16 and the drain region 17. Further, the second embodiment is advantageous when two different types of impurities are doped in the same source region 16 and drain region 17 as in the DSA structure or the DMOS structure. In this embodiment, the impurity can be doped by various doping methods such as ion implantation, predeposition and molecular layer deposition (MLD). Specifically, the ion implantation method is advantageous in the second embodiment. In this embodiment, during the course of the succeeding etching of the polysilicon film 4 over the second active area 10, an oxide or other compound may be occasionally deposited on a sidewall of the etched polysilicon film 4. In order to avoid such an etching residue, it is advantageous to use an anisotropic etching gas such as $SF_6$, $CF_4$ and $NF_3$. Moreover, the present embodiment is effective for processing the a specific type of the semiconductor substrate such as an SOI substrate and an SIMOX substrate, in which a semiconductor layer is superposed on an insulating layer. This embodiment is also applicable to a TFT structure in which the semiconductor substrate is composed of a thin film, and to another structure where the semiconductor substrate and the gate electrode are composed of a semiconductor thin film. Moreover, the second embodiment is advantageous in the case of doping different impurities into a plurality of different regions in self-alignment manner. Still moreover, the second embodiment is advantageous in a multi-layer structure where a gate electrode and a lead electrode are formed of multiple layers. Particularly, the present embodiment is effective to etch multi-layers of a polysilicon film by the same mask.

Figure 4A:
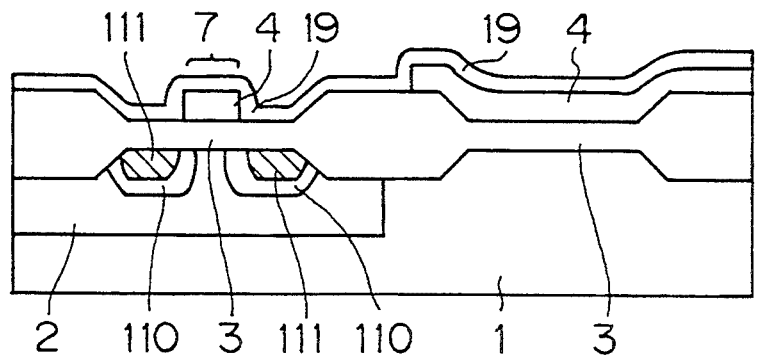
FIGS. 4(a) and 4(b) are a process step diagram showing a third embodiment of the invention.
Figure 4B:
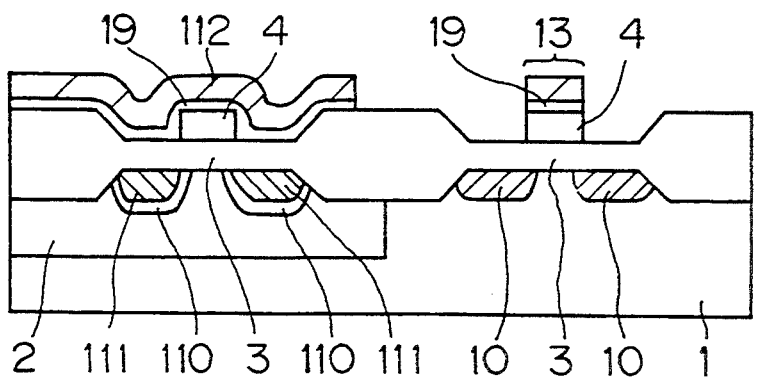

FIGS. 4(a) and 4(b) are a process step diagram showing a third embodiment of the inventive fabrication method in which a lightly-doped drain region or an LDD region is formed in one of the CMOS transistor pairs of the semiconductor integrated circuit device. In a manner similar to the FIG. 2(b) step of the second embodiment, a polysilicon film 4 is patterned in a first gate electrode area 7, and then the first conductivity type impurity is doped through a mask of the first gate electrode area 7 to form a first lightly doped impurity region 110 in a well 2. Then, an old photoresist is removed and an insulating film 19 is coated in the form of a thermally oxidized film over a substrate 1 at about 800° C. in the order of 20 nm thickness in order to avoid channeling or generation of defects along an edge of a gate oxide film 3. Thereafter, the first conductivity type impurity is again doped to form a first heavily doped impurity region 111 to thereby obtain the LDD channel structure in a first transistor (FIG. 4(a)). Thereafter, the insulating film 19 is removed from an adjacent second device area by wet etching. Then, the polysilicon film 4 is again patterned through a new photoresist 112 to form a second gate electrode area 13. Subsequently, the second conductivity type impurity is doped through a mask of the second gate electrode area 13 in self-alignment manner to form a second impurity region 10 which constitutes a source drain of a second transistor (FIG. 4(b)). Alternatively in the third embodiment, the first conductivity type impurity may be doped to form a lightly doped impurity region after forming an insulating film over the etched polysilicon film 4.

Figure 5A:
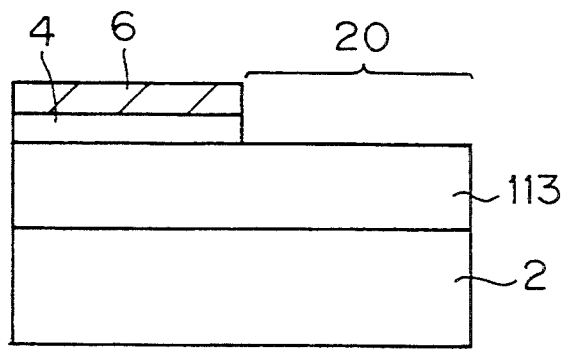
FIGS. 5(a) and 5(b) are a partial magnification of a process step diagram showing a second embodiment of the invention.
Figure 5B:
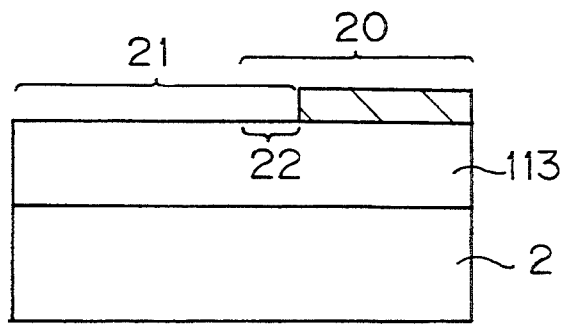

FIG. 5(a) is a magnification of a section A in FIG. 2(b), and FIG. 5(b) is that of a section B in FIG. 3(a), in which are formed a source drain impurity region, a lead resistor impurity region, a gate electrode, and a lead electrode of polysilicon on the semiconductor substrate. In a manner similar to the second embodiment, a polysilicon film 4 is selectively etched through a mask of a precedingly patterned photoresist 6 to thereby provide a first etched region 20 over a thick oxide film 113 or a field oxide film (FIG. 5(a)). The left polysilicon film 4 is again selectively etched through a mask of a succeedingly patterned photoresist (not shown) to provide a second etched region 21 over the field oxide film 113 (FIG. 5(b)). As shown in these figures, the first and second etched regions 20 and 21 are partly overlapped with each other to provide a duplicatively etched region 22 along their border. A width of the duplicatively etched region 22 is set greater than mask alignment allowance so as to prevent an etching residue. This duplicatively etched region 22 is preferably disposed along the thick oxide film 113 or field oxide film in case an etching rate difference is not so great between the polysilicon film 4 and the underlying oxide film 113. Namely, providing the duplicatively etched region makes the second embodiment further practical, because the duplicatively etched region 22 of the polysilicon film 4 is set wider than the given mask alignment allowance or margin to avoid etching remains.

Figure 6A:
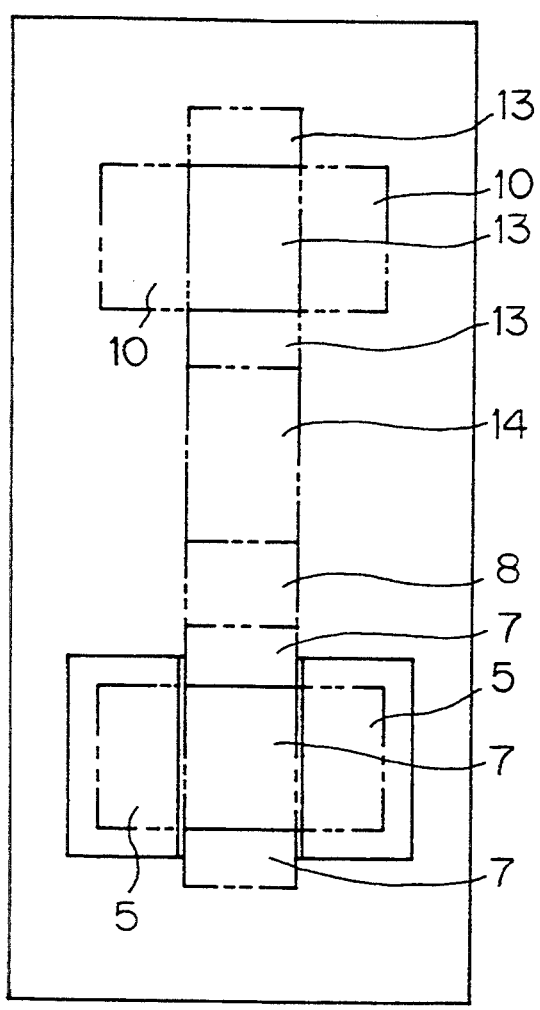
FIGS. 6(a) and 6(b) are diagrams of mask patterns used in a second embodiment of the invention.
Figure 6B:
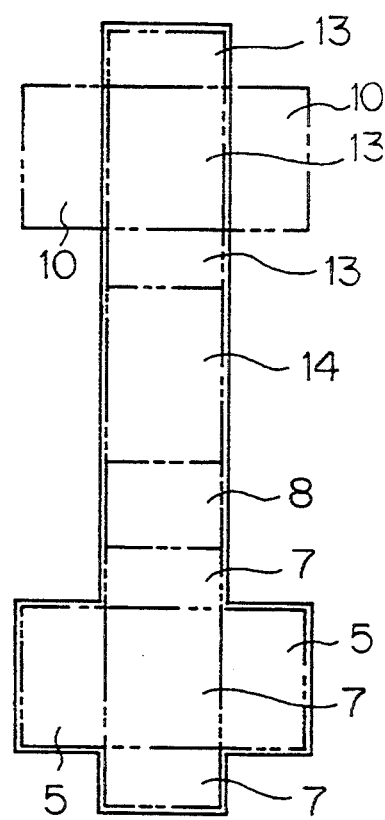

FIGS. 6(a) and 6(b) show mask patterns used in a second embodiment of the inventive fabrication method where a source drain impurity region, a lead resistor impurity region, a gate electrode and a polysilicon lead electrode are formed in the semiconductor device. In the second embodiment, a first mask pattern is used to remove selectively a polysilicon film to expose a first active area 5 in which a source drain impurity region is to be formed by doping the first conductivity type impurity. This first mask pattern 7 has a pair of openings which are dimensioned to include the first active area 5 with a certain mask alignment margin. The first mask pattern can be easily designed, if the mask design data formed by adding a certain mask alignment margin to a conventional mask size which was used for forming a first impurity region of a first conductivity type (drain, source) 5; and the conventional mask data for forming regions 7, 13 to become gate electrodes, and lead regions 8, 14 are put together. (FIG. 6(A)). Next, a second mask pattern is used to selectively etch again the polysilicon film. This second mask pattern masks the first doped active area 5, the first gate electrode area 7, the first lead electrode area 8, the second gate electrode area 13 and the second lead electrode area 14 with a certain mask alignment margin, while uncovering the remaining area including the second active area 10 into which the second conductivity type impurity is to be doped to form a second conductivity type source drain impurity region can be easily designed by adding a conventional mask design data used for making a first impurity region of a first conductivity type (drain, source) 5 to the mask design data used for making the gate electrodes region 7, 13 and lead design 8, 14. (FIG. 6(b)). The pair of mask patterns are efficiently utilized to fabricate the CMOS type semiconductor integrated circuit device in a manner similar to the second embodiment. The pair of mask patterns can be designed easily by modifying mask patterns utilized in the conventional fabrication method of the CMOS type semiconductor integrated circuit device.

Figure 7A:
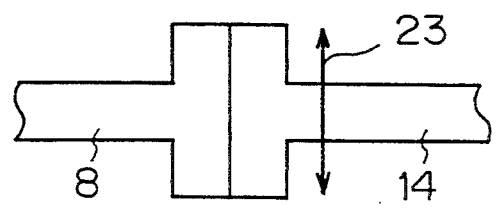
FIGS. 7(a) and 7(b) are pattern diagrams of the lead connection area associated to the second embodiment of the invention.
Figure 7B:
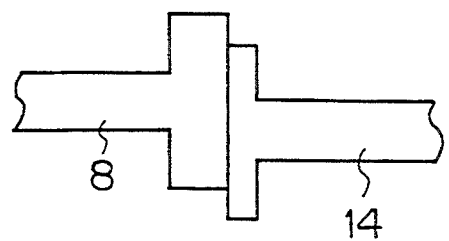

In the second embodiment, preferably a junction width 23 (FIG. 7(a)) of the first and second lead electrode areas 8, 14 is dimensioned greater than a theoretically needed width by twice as much as the mask alignment margin in order to avoid a resistance increase in a junction portion due to the mask alignment error. FIG. 7(a) shows a case where the correct mask alignment is carried out, and FIG. 7(b) shows another case where a poor mask alignment is carried out. Even in the latter case, the junction resistance can be suppressed below a practical level.

FIGS. 8(a), 8(b) and FIGS. 9(a), 9(b) are a process step diagram showing a fourth embodiment of the inventive method in which a device isolation impurity region, a lead resistor impurity region and a device region are formed in the CMOS type semiconductor integrated circuit device. A nitride film 31 is formed in superposed relation to an underlying pad oxide film 30 over a surface of a semiconductor substrate 1 of the first conductivity type and over a surface of a well 2 of the second conductivity type (FIG. 8(a)). Thereafter, a first photoresist 33 is applied over the nitride film 31. Then, the first photoresist 33 is selectively patterned and removed from a first device isolation area 32 and a first lead resistor area 35. Subsequently, the nitride film 31 is etched and removed from the first device isolation area 32 and the first lead resistor area 35 while covering a first device area 34. Then, the first conductivity type impurity is doped through a mask of the patterned nitride film 30 into both of the first device isolation area 32 and the first lead resistor area 35 (FIG. 8(b)). After removing the first or old photoresist 33, a second or new photoresist 38 is applied over the entire surface of the substrate 1 including the well 2. Then, the second photoresist 38 is patterned and selectively removed from a second device isolation area 37 and a second lead resistor area 40 while covering a second device area 39 surrounded by a second device isolation area 37. The nitride film 31 is again etched selectively to expose the second device isolation area 37 and the second lead resistor area 40. Thereafter, the second conductivity type impurity is doped through a double layer mask of the remaining second photoresist 38 and the nitride film 31 into the second device isolation area 37 and the second lead resistor area 40 (FIG. 9(a)). Lastly, the left photoresist 38 is removed. By this process there are formed over the substrate 1 a pair of device isolation impurity regions 42, 43 of the opposite conductivity types for isolation of an individual transistor of the CMOS type semiconductor integrated circuit device, lead resistor impurity regions 44 having different conductivity types, and a pair of nitride film masks 75 which cover device regions into which a CMOS pair of transistors are to be formed (FIG. 9(b)). According to the fourth embodiment, the device isolation impurity regions of opposite conductivity types are formed by two photoresist patterning process steps for a CMOS pair of transistors of the opposite conductivity type.

Though not shown in the figures, in the fourth embodiment, if a P type well is formed in an N type semiconductor substrate, the device isolation impurity region formed in the surface of the P type well has a reduced impurity density due to segregation along a boundary to a thermally oxidized film or LOCOS film. On the other hand, if a P type semiconductor substrate is adopted, an impurity density of the device isolation impurity region formed in a surface of an N type well is reduced along a boundary to a thermally oxidized film or LOCOS film due to a segregation phenomenon. Therefore, it is necessary to form device isolation impurity regions of different conductivity types particularly when adopting the N type semiconductor substrate. The fourth embodiment is specifically advantageous in such a case. The impurity may be doped by various methods; such as ion implantation, predeposition and molecular layer diffusion. Particularly, the ion implantation method is advantageous in the fourth embodiment. In the fourth embodiment, during the course of etching of the nitride film 31 over the second device isolation area 37 and other areas, an oxide or a compound may be grown on a sidewall of the etched nitride film. In view of this, the use of anisotropic etching gas such as $SF_6$, $CF_4$ and $NF_3$ is advantageous in order to avoid generation of an etching residue. Further, the fourth embodiment can be applied effectively to specific types of substrates such as an SOI substrate and an SIMOX substrate where a semiconductor substrate is formed on an insulating layer. Moreover, the fourth embodiment can be applied effectively to the TFT structure where a semiconductor substrate is composed of a semiconductor thin film, and to another structure where a semiconductor substrate and a gate electrode are composed of a semiconductor thin film. Still moreover, the fourth embodiment is advantageous where different impurities are doped into a multiple of different areas in self-alignment manner to form device isolation impurity regions. In addition, the fourth embodiment is specifically advantageous where the device isolation impurity region is composed of a multi-layer structure.

Figure 10A:
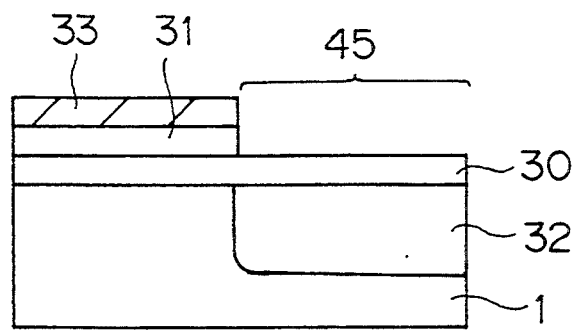
FIGS. 10(a)–10(c) are a partial magnification of a process step diagram showing a seventh embodiment of the invention.
Figure 10B:
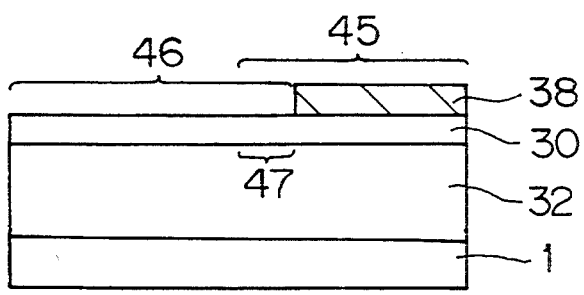
Figure 10C:
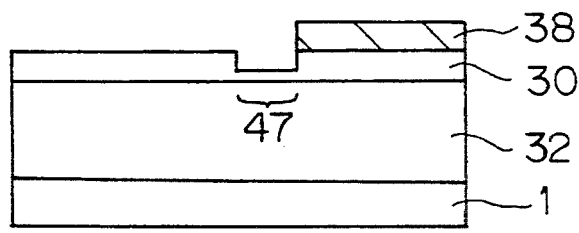

FIGS. 10(a)–10(c) are a partial magnification of a process step diagram showing a seventh embodiment of the inventive method of forming a device isolation impurity region, a lead resistor impurity region and a device region in the semiconductor integrated circuit device. In a manner similar to the fourth embodiment, a nitride film 31 is etched by a preceding patterning step using a first photoresist 33 to expose a first etched area 45 (FIG. 10(a)). The same nitride film is again etched by a succeeding patterning step using a second photoresist 38 to expose a second etched area 46. The second etched area 46 is partially overlapped with the first etched area 45 to provide a duplicatively etched area 47 (FIGS. 10(b)). A width of the duplicatively etched area 47 should be set greater than a mask alignment allowance in order to avoid an etching remains. Namely, the seventh embodiment can be combined with the fourth embodiment such that when etching the nitride film 31 twice the duplicatively etched area 47 is dimensioned greater than a given mask alignment margin so as to avoid etching remains. In this fourth embodiment, a thickness of an underlying pad oxide film 30 is determined according to a thickness ratio of the nitride film 31 and pad oxide film 30, and an etching rate ratio thereof. If the thickness of the pad oxide film 30 were too small, the surface of the semiconductor substrate might be etched when removing the nitride film 31 in order to expose a second device isolation area and other areas (FIG. 10(c)). Provided that the etching rate ratio is 3:1 between the nitride film and the pad oxide film, the thickness of the pad oxide film should be set greater than 50 nm while the thickness of the nitride film is set to 150 nm.

Figure 11A:
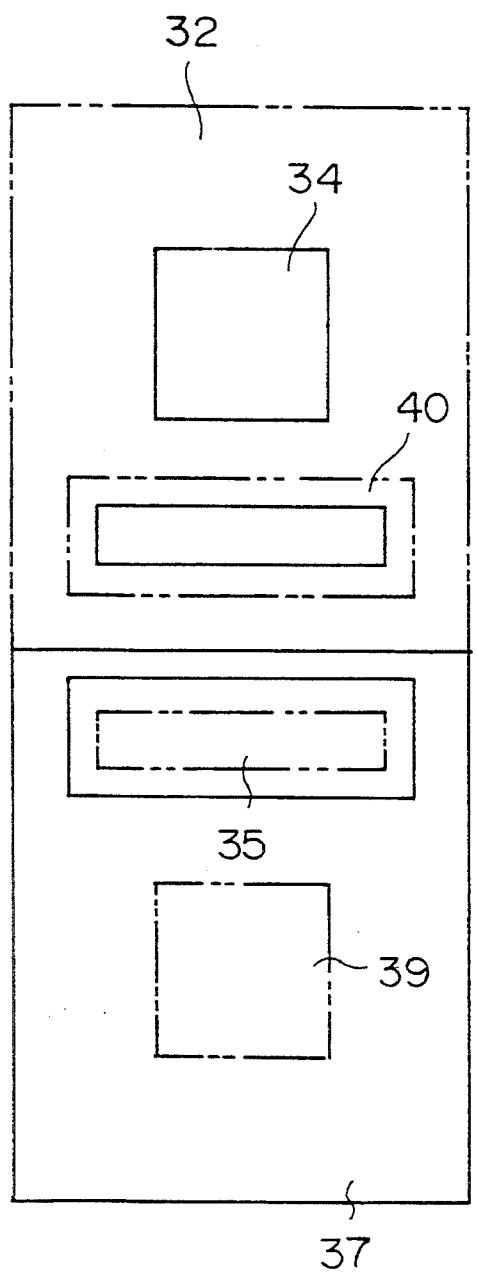
FIGS. 11(a) and 11(b) are diagrams of mask patterns used in a fourth embodiment of the invention.
Figure 11B:
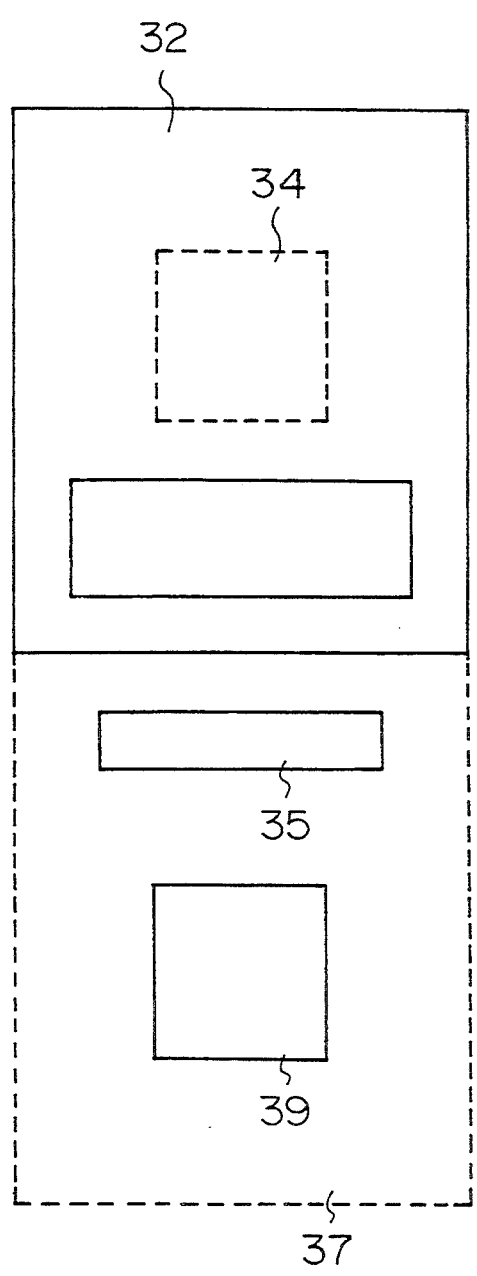

FIGS. 11(a)–11(b) show a pair of first and second mask patterns used in a fourth embodiment of the inventive method of forming a device isolation impurity region, a lead resistor impurity region and a device region in the semiconductor integrated circuit device. In FIG. 11(a), the first mask pattern is designed to cover a first device area 34 and a second lead resistor area 40, and to uncover a first device isolation area 32 surrounding the first device area 34 and a first lead resistor area 35 with a given mask alignment margin. The first mask pattern can be easily designed, if the mask design data formed by adding a certain mask alignment margin to a conventional mask size which was used for forming a first device isolation area of a first conductivity type 32, 35; and the conventional mask data for forming regions 34, 39 to become device regions, and a lead resistor region 40 are put together. (FIG. 11(a)). On the other hand, the second mask pattern used in a subsequent patterning of a second photoresist film is designed to cover the first device isolation area 32 and first lead resistor area 35, which have been doped with an impurity, as well as to cover the first device area 34. The second mask pattern uncovers the second lead resistor area 40 and the second device isolation area 37 in order to effect doping of another impurity into these uncovered areas 40 and 37 while covering the second device area 39 surrounded by the second device isolation area 37. The second mask pattern can be easily designed, if the conventional mask design data for forming a first device isolation area of a first conductivity type 32 and the mask design data for forming a lead resistor region 35 are put together (FIG. 11(b)). These first and second mask patterns can be easily designed by simply modifying mask patterns utilized in the conventional fabrication method of the CMOS type semiconductor integrated circuit device. Though not shown in the figures, the fourth embodiment can be applied to the forming of a trench in a surface of the semiconductor substrate for the device isolation. Moreover, the fourth embodiment may be advantageous in forming the device isolation region in specific types of the semiconductor substrate such as a SOI substrate or a SIMOX substrate, in which a semiconductor layer is formed over an insulating layer.

Figure 9A:
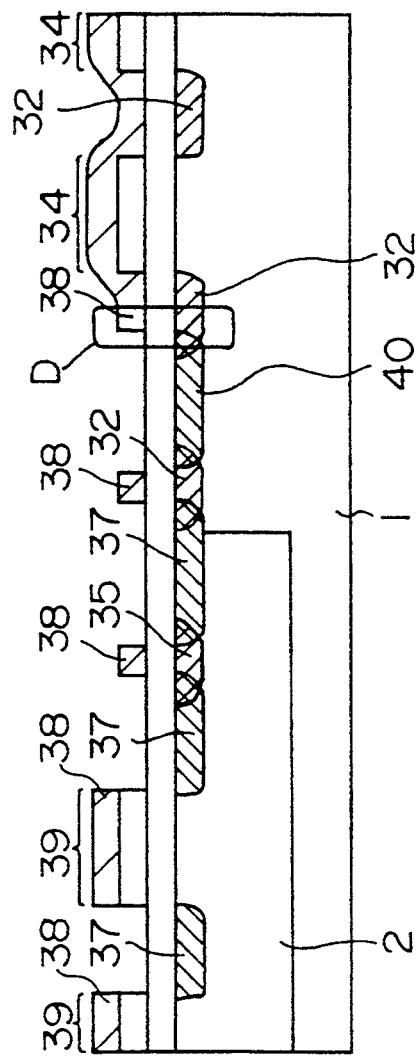
FIGS. 9(a) and 9(b) are a process step diagram showing a fourth embodiment of the invention.
Figure 9B:
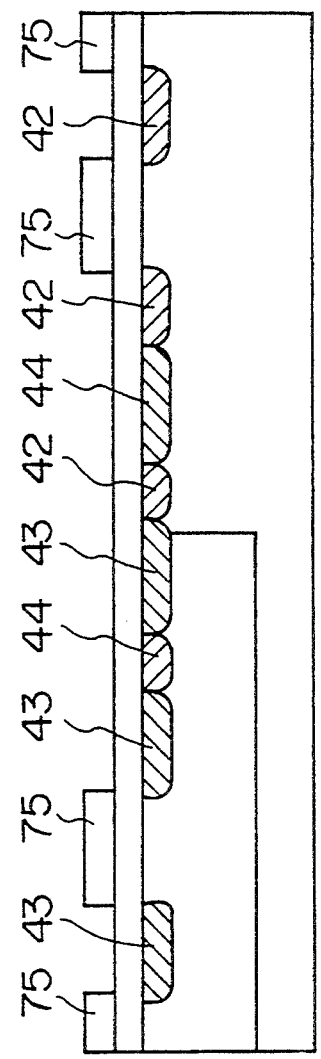
Figure 12:
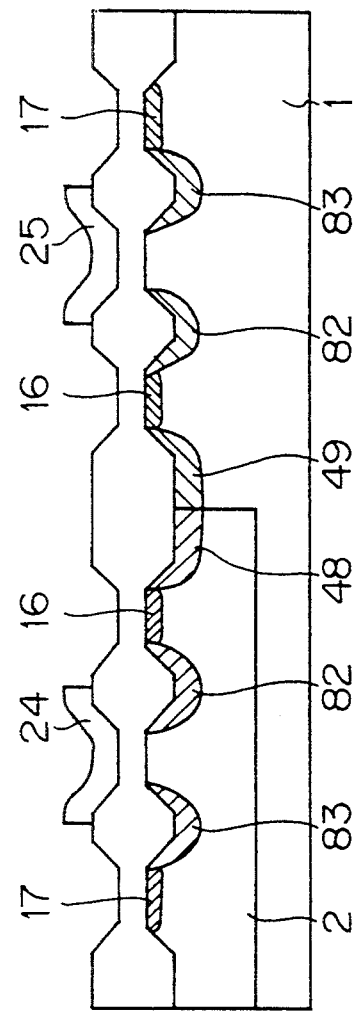
FIG. 12 is a sectional diagram showing a fifth embodiment of the invention.
Figure 13A:
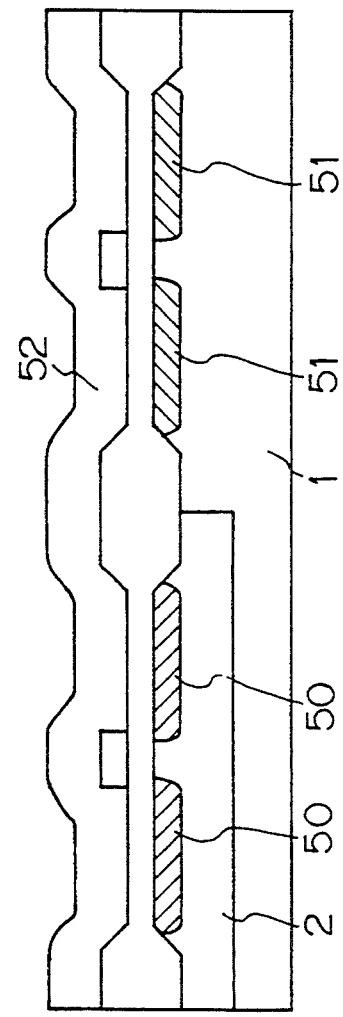
FIGS. 13(a) and 13(b) are a process step diagram showing a sixth embodiment of the invention.
Figure 13B:
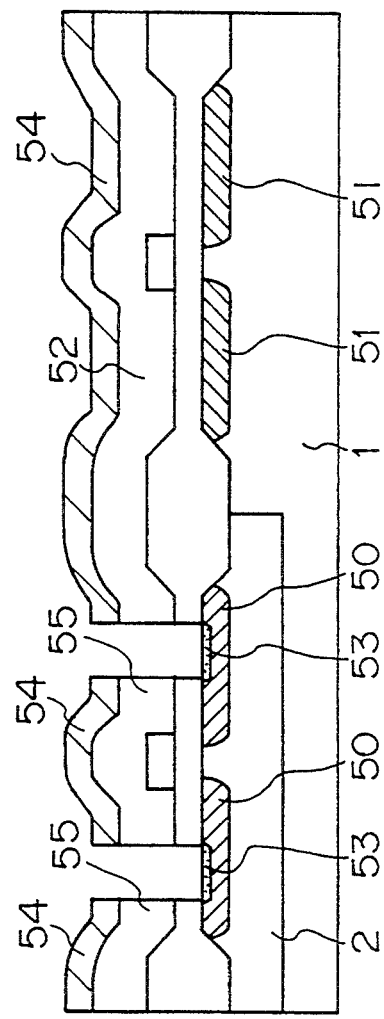
Figures 17A, 17B, 17C:
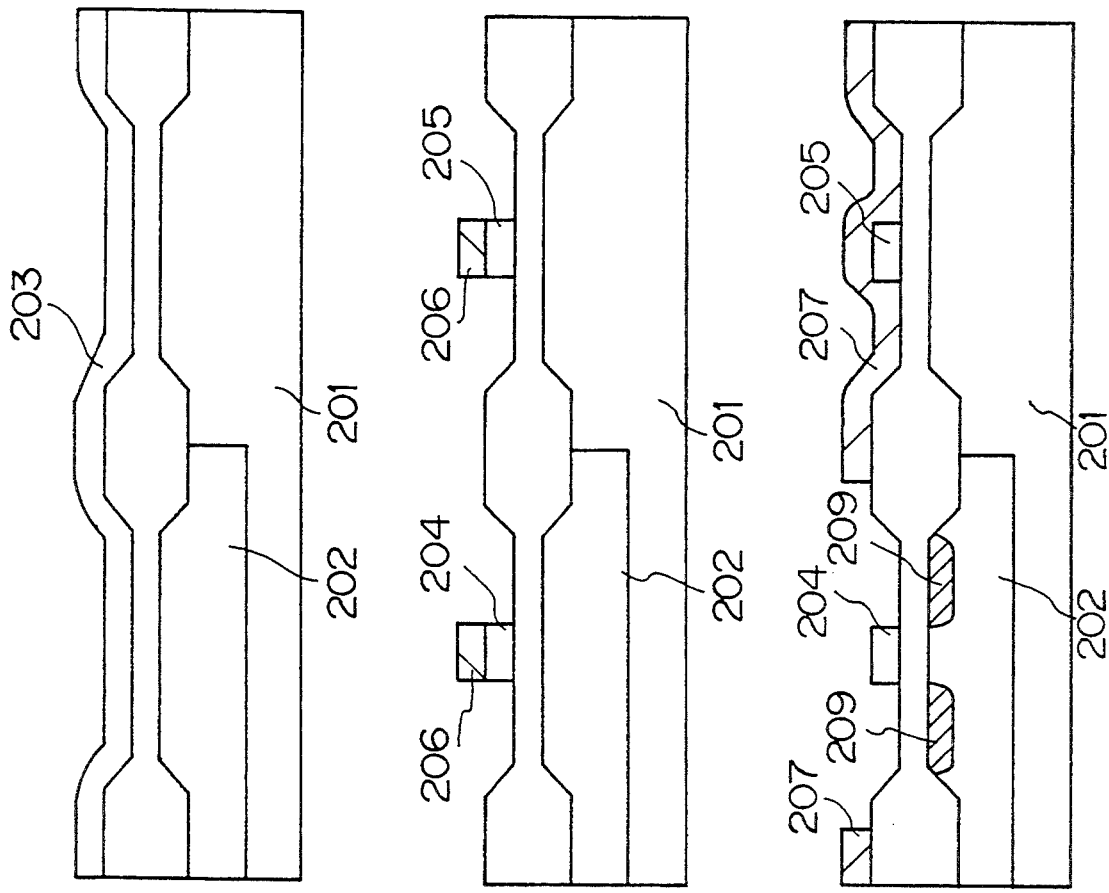
FIGS. 17(a)–17(c) are a process step diagram showing a first prior art doping process.
Figure 18A:
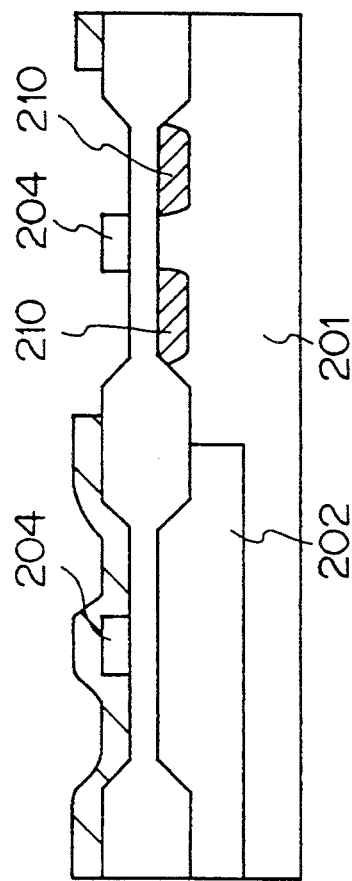
FIGS. 18(a) and 18(b) are a process step diagram showing a first prior art doping process.
Figure 18B:
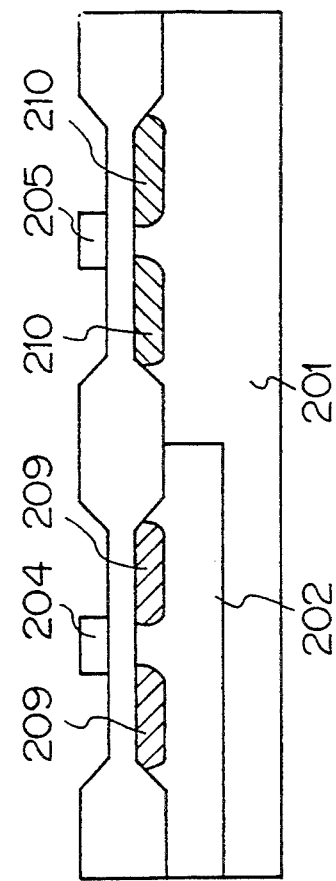
Figure 19A:
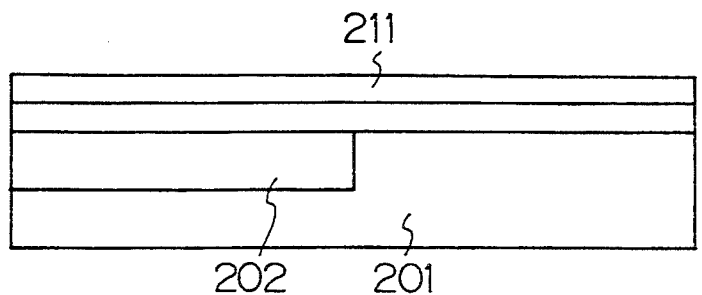
FIGS. 19(a)–19(e) are a process step diagram showing a second prior art doping process.
Figure 19B:
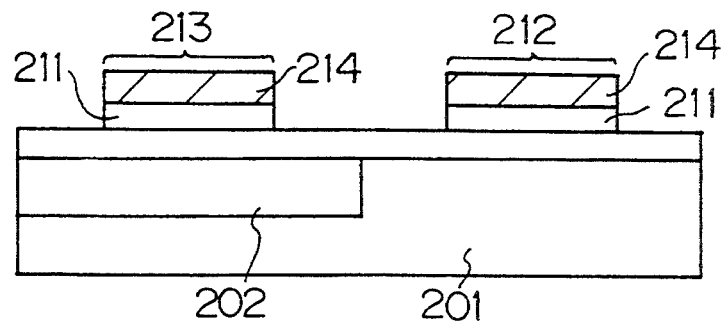
Figure 19C:
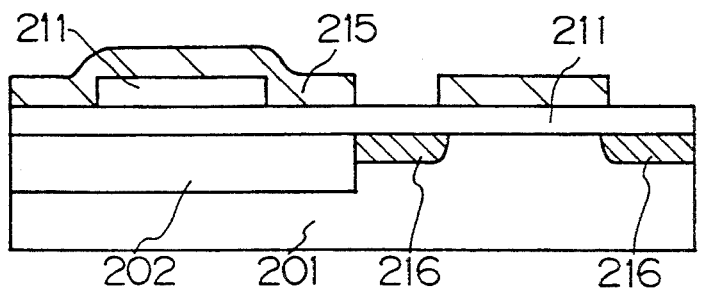
Figure 19D:
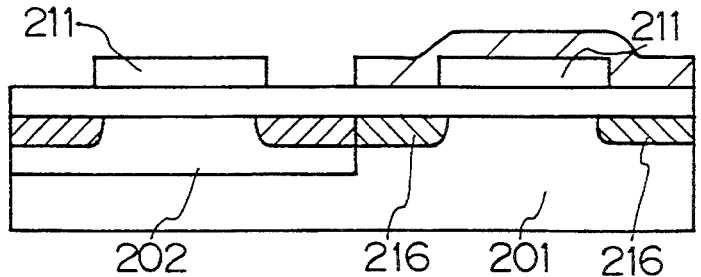
Figure 19E:
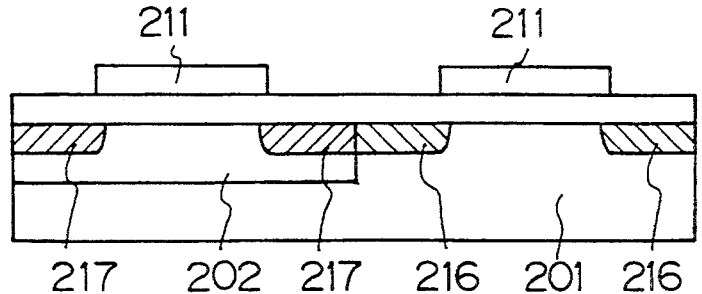
Figure 20A:
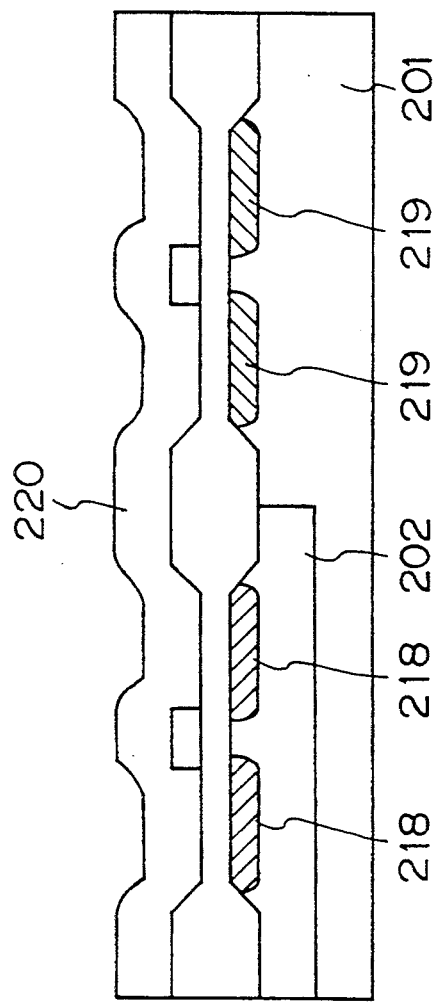
FIGS. 20(a) and 20(b) are a process step diagram showing a third prior art doping process.
Figure 20B:
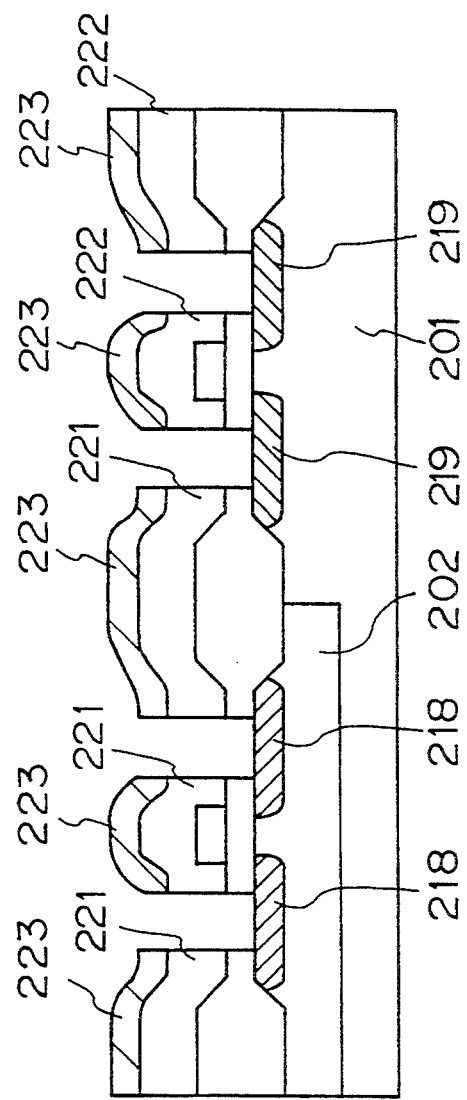
Figure 21A:
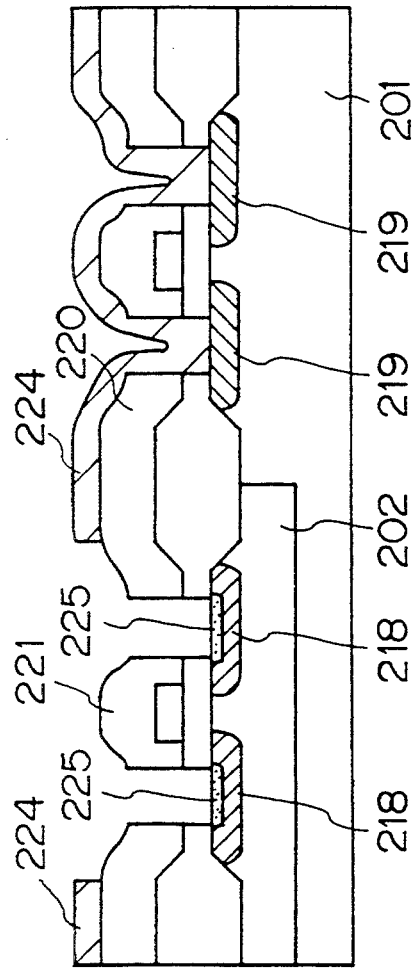
FIGS. 21(a)–21(c) are a process step diagram showing a third prior art doping process.
Figure 21B:
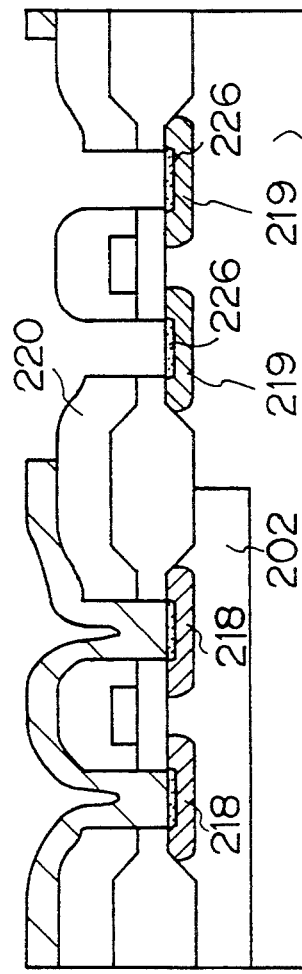
Figure 21C:
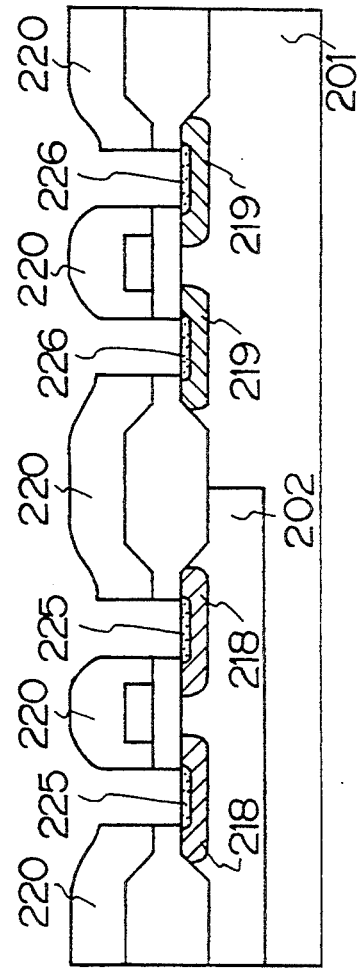

FIG. 12 is a sectional diagram of the high withstand voltage CMOS type semiconductor integrated circuit device, illustrating a fifth embodiment of the inventive method for forming a device region, a device isolation impurity region and a lead resistor impurity region. In a manner similar to the fourth embodiment, a first device isolation impurity region 48 of the first conductivity type is formed through a preceding patterning step, and a second device isolation impurity region 49 of the second conductivity type is formed through a succeeding patterning step. In this embodiment, a part of the first and second device isolation regions 32, 37 in FIG. 9(a) are utilized as a lightly doped source region 82, a lightly doped drain region 83 and the first and second device isolation regions 48, 49 in FIG. 12. In this case, the first and second device isolation impurity regions 48, 49 including the lightly doped source and drain regions 82, 83 are subjected to a thermal oxidation to form a layer of 60 nm –110 nm so as to raise a withstand voltage of the CMOS type semiconductor integrated circuit device over 5–100 V. This thermal oxidation can be carried out concurrently with another thermal oxidation of a device isolation impurity region of a CMOS type logic circuit portion of the semiconductor device. Stated otherwise, a high withstand voltage CMOS type circuit and a low withstand voltage CMOS type logic circuit can be integrated in the same semiconductor substrate without increasing the number of masking or patterning steps. Namely, the fifth embodiment is specifically advantageous in forming the first and second device isolation impurity regions 48 and 49 of different conductivity types, which are utilized as the lightly doped source and drain regions effective to raise the withstand voltage of the device, as well as the device isolation region of the CMOS type logic circuit portion.

FIGS. 13(a), 13(b) and FIGS. 14(a), 14(b) are a process step diagram showing a sixth embodiment of the inventive fabrication method for forming a contact impurity region for electrical contact to a metal lead through an interlayer insulating film in the CMOS type integrated circuit device. An insulating film 52 is applied over a semiconductor substrate 1 which is formed with a first transistor having a source drain impurity region 50 of the first conductivity type in a well 2 of the second conductivity type, and a second transistor having another source drain impurity region 51 of the second conductivity type in a substrate portion of the first conductivity type (FIG. 13(a)). Thereafter, a first photoresist 54 is applied over the substrate 1 and is patterned in registration with a pair of first contact areas 53 on the first source drain impurity region 50. Then, the insulating film 52 is selectively etched through a mask of the photoresist 54 to form contact holes to expose the pair of first contact areas 53. The removing part of the insulating film 52 serves as a first interlayer film 55. Subsequently, an impurity of the first conductivity type is doped through the contact holes into the contact areas 53 which are to be utilized for an electric contact with a metal lead pattern (FIG. 13(b)). Next, after removing the first photoresist 54, a second photoresist 58 is applied over the substrate 1, and is patterned in registration with a second pair of contact areas 57 on the second source drain region 51. Thereafter, the insulating film 52 is etched through a mask of the second photoresist 58 to form contact holes communicating with the second contact areas 57. At this stage, the remaining insulating film 52 serves as a second interlayer film 59 over the second transistor. Subsequently, another impurity of the second conductivity type is doped through the contact holes into the second contact areas 57 (FIG. 14(a)). Lastly, the photoresist 58 is removed so that a densely doped impurity region 61 is provided on the first source drain region 50 of the first transistor and another densely doped impurity region 62 is provided on the second source drain region 51 of the second transistor. These densely doped impurity regions are effective to reduce a contact resistance between the source drain region and an overlaying metal lead pattern (FIG. 14(b)). According to the sixth embodiment of the inventive method, the densely doped impurity regions can be formed through two steps of the patterning process of the insulating film over a CMOS pair of transistors of the opposite conductivity types in order to reduce a contact resistance to a metal lead pattern.

The impurity can be doped using various methods such as ion implantation, predeposition and the MLD method. The ion implantation method is particularly advantageous in the sixth embodiment. The present embodiment may be effectively applied to a specific type of substrate such as SOI substrate and SIMOX substrate, in which a semiconductor substrate of the first conductivity type is disposed on an insulating substrate.

FIGS. 15(a)–15(b) and FIGS. 16(a), 16(b) are a process step diagram showing a seventh embodiment of the inventive method in which a lightly doped source drain impurity region, a gate electrode and a lead electrode of a polysilicon film are formed in a the CMOS type semiconductor integrated circuit device. A polysilicon film 4 is formed over a gate insulating film 3 on a surface portion of a semiconductor substrate 1 of the first conductivity type and on a surface of a well 2 of the second conductivity type (FIG. 15(a)).

Next, a first photoresist 91 is applied to the substrate surface, and is selectively patterned to mask a first gate electrode area 92 and a first lead electrode area 93 while uncovering a surrounding area around the first gate electrode area 92 and other given areas. Then, the polysilicon film 4 is selectively etched through the mask of the photoresist 91 to expose partly the substrate surface. Subsequently, an impurity of the first conductivity type is doped into the exposed part of the semiconductor substrate surface to thereby form a first lightly doped source drain region 90 in self-alignment manner with respect to the first gate electrode area 92 and to concurrently form a lead impurity region (90) (FIG. 15(b)).

Then, after removing the old photoresist 91, a new second photoresist 94 is applied and patterned to selectively mask a second gate electrode area 96 and a second lead electrode area 97, while uncovering a surrounding area around the second gate electrode area 96 and other given areas. Subsequently, the polysilicon film 4 is again etched through a mask of the second photoresist to remove an unnecessary portion thereof to expose partly the substrate surface. Then, another impurity of the second conductivity type is doped into the exposed semiconductor surface in self-alignment manner with respect to the second gate electrode area 96 to thereby form a second lightly doped source drain impurity region 95 and a second lead impurity region (95) (FIG. 16(a)).

After removing the second photoresist 94, an oxide film is formed on the remaining polysilicon film 4 and its sidewall by deposition or thermal oxidation, and subsequently impurities are doped into the substrate surface to form a source region 16, a drain region 17 and a lead resistor impurity region 18. The thus etched polysilicon film 4 constitutes gate electrodes 24, 25 and lead electrodes 26, 27 of the CMOS pair of transistors of opposite conductivity types. Further, the thus formed impurity regions constitute the lightly doped source and drain regions 90, 95 of the CMOS pair of transistors of opposite conductivity types. Moreover, the impurities of the different conductivity types are selectively doped through the oxide film formed on the sidewall and the top face of the etched polysilicon film 4 into the lightly doped impurity regions in duplicative manner to form the densely doped source and drain regions 16, 17 (FIG. 16(b)). Namely, the number of photoresist patterning process steps can be reduced according to the seventh embodiment in forming of the lightly doped source drain region and the gate electrode of the CMOS pair of transistors.

Figure 22A:
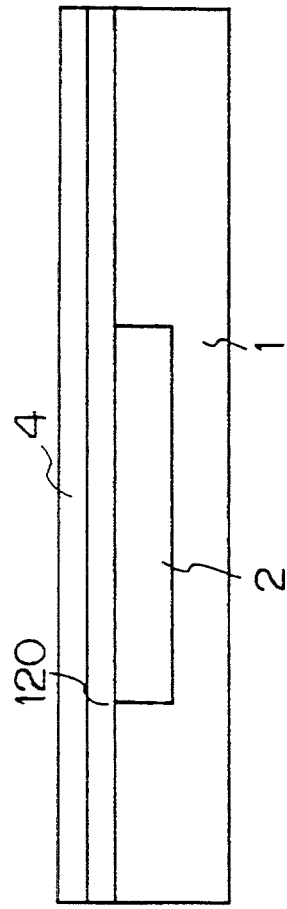
FIGS. 22(a)–22(c) are a process step diagram showing an eight embodiment of the invention.
Figure 22B:
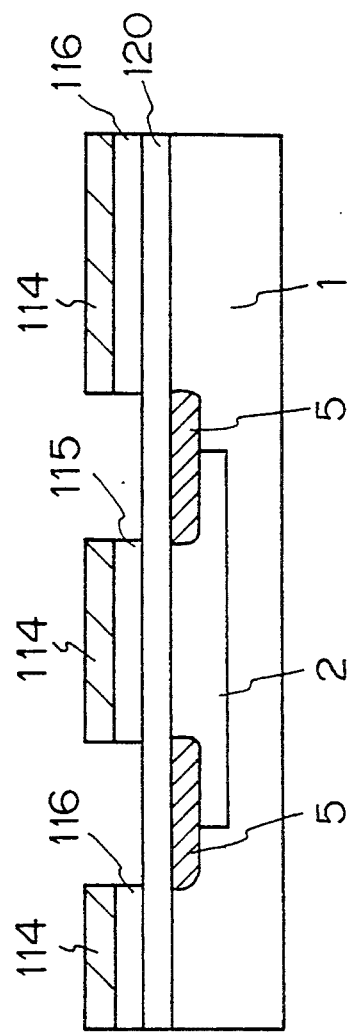
Figure 22C:
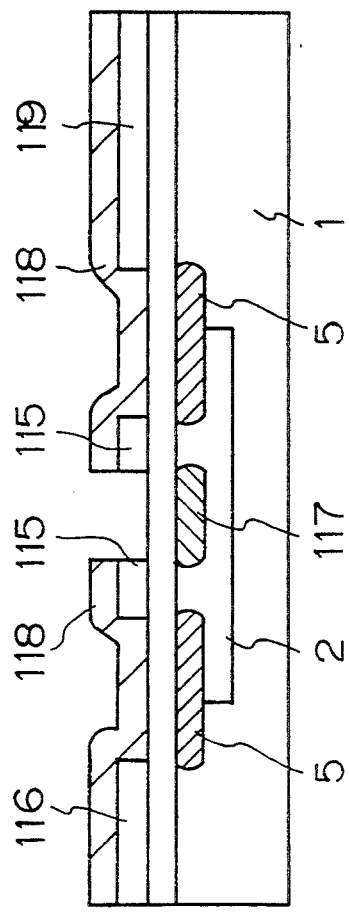

FIGS. 22(a)-22(c) are a process step diagram showing an eighth embodiment of the inventive method for producing a bipolar type phototransistor device having an emitter region, a lead resistor impurity region and an inversion suppressing electrode composed of a polysilicon film, which suppresses an inversion of a semiconductor substrate surface. A polysilicon film 4 is formed over an insulating film 120 on a surface of a semiconductor substrate 1 having the first conductivity type and on a surface of a well 2 having the second conductivity type (FIG. 22(a)).

Next, a first photoresist 114 is applied to the substrate surface, and is then patterned to form a mask effective to define a first lead electrode 116 and an inversion suppressing electrode 115 composed of the polysilicon film 4 effective to suppress an inversion of the substrate surface. The first photoresist 114 is selectively removed to define a first impurity region 5 in the substrate surface. Thereafter, the polysilicon film 4 is selectively removed by etching through the mask of the first photoresist 114 to uncover the first impurity region 5. Then, an impurity of the first conductivity type is doped in self-alignment manner through the patterned inversion suppressing electrode 115 into the first impurity region 5 (FIG. 22(b)).

After removing the first photoresist 114, a second photoresist 118 is applied over the substrate 1, and is then patterned to uncover a part of the inversion suppressing electrode 115 to define a second impurity region 117 in the well 2 while masking a second lead electrode 119. Thereafter, the polysilicon film 4 is again etched through a mask of the second photoresist 118 to expose the second impurity region 117. Then, another impurity of the second conductivity type is doped into the exposed second impurity region 117 to form an emitter region of a bipolar type phototransistor in self-alignment manner through the twice patterned inversion suppressing electrode 115. Lastly the second photoresist 118 is removed (FIG. 22(c)).

In this eighth embodiment, the polysilicon film 4 is twice etched to form the inversion suppressing electrode 115 and the lead electrodes 116, 119, while the impurity regions 5, 117 of the opposite conductivity types are formed in the semiconductor substrate to constitute the bipolar type phototransistor device. Namely, in this embodiment, a number of the photoresist patterning process steps can be saved in forming the impurity regions of the opposite conductivity types and the inversion suppressing electrode of polysilicon in the bipolar type phototransistor device.

As described above, the present invention can achieve the following effects:

(1) According to the second embodiment of the inventive method for forming a source drain impurity region in the CMOS type semiconductor integrated circuit device, a first pattern step is carried out to pattern a first gate electrode and subsequently an impurity of the first conductivity type is doped through the first gate electrode to form a first source drain impurity region. Subsequently a second patterning step is carried out to pattern a second gate electrode while masking the first source drain impurity region. Then, another impurity of the second conductivity type is doped through the second gate electrode to form a second source drain impurity region. By such process a, at least one photoresist patterning process step can be saved as compared to the prior art, in making the source drain impurity regions in the CMOS transistor pair, thereby achieving a reduction in the production cost of the semiconductor device.

(2) In the fourth embodiment of the inventive method for forming device isolation impurity regions in the CMOS type semiconductor integrated circuit device, a first patterning step is carried out to pattern an anti-oxidation nitride film, and then an impurity of the first conductivity type is doped through a mask of the patterned nitride film to form a first device isolation impurity region. Subsequently, a second patterning step is carried out to further pattern the same nitride film while covering the first device isolation impurity region. Then, another impurity of the second conductivity type is doped through the mask of the nitride film to form a second device isolation impurity region of the opposite conductivity type. By such a process, at least one photoresist patterning step can be saved as compared to the prior art to achieve reduction of the production cost in forming the device isolation impurity regions around the CMOS transistor pair.

(3) In the sixth embodiment of the inventive method for making low resistance contact impurity regions of opposite conductivity types in the CMOS type semiconductor integrated circuit device, a first patterning step is carried out to form first contact holes through an interlayer insulating film, and then an impurity of the first conductivity type is doped through the contact holes to form first contact impurity regions. Subsequently, a second patterning step is carried out to form second contact holes in the interlayer insulating film while masking the first contact holes, and then another impurity of the second conductivity type is doped through the second contact holes to form second contact impurity regions of the opposite conductivity type. By such a process, at least one photoresist patterning step can be saved as compared to the prior art to thereby reduce production cost in making the low-resistance contact impurity regions of different conductivity types in the CMOS transistor pair.

(4) According to the seventh embodiment of the inventive method for forming lightly doped source drain impurity regions in the CMOS type semiconductor integrated circuit device, a first patterning step is carried out to pattern a first gate electrode, and then an impurity of the first conductivity type is doped in self-alignment manner with respect to the first gate electrode to form a first lightly doped source drain region. Subsequently a second patterning step is carried out to pattern a second gate electrode while masking the first lightly doped source drain region, and then another impurity of the second conductivity type is doped in self-alignment manner with respect to the second gate electrode to form a second lightly doped source drain region of the opposite conductivity type. By such a process, at least one step photoresist patterning step can be saved to thereby reduce the production cost in forming the LDD structure in the CMOS transistor pair.

(5) Further, according to the second embodiment, when using ion implantation for doping an impurity to form a source drain impurity region in self-alignment manner with respect to a gate electrode, the gate electrode is covered with photoresist during the course of the ion implantation such that an acceleration energy of an impurity ion can be blocked by the photoresist to avoid injection of the impurity into a channel region under the gate electrode. Consequently, a depth :profile of the impurity density can be optimally set in the source drain region by selecting the acceleration energy in the wide range, thereby contributing to micronization of the gate electrode and an increase in the reliability of the semiconductor integrated circuit device.

(6) For the same reason, the thickness of the gate electrode can be optimally and freely set in a wide range, thereby facilitating micronization of the gate electrode and leveling of the gate electrode surface to contribute to higher density integration of the semiconductor device.

(7) Moreover in the fourth embodiment of the inventive method, the ion implantation method can be advantageously utilized to dope an impurity to form the device isolation region in self-alignment manner with respect to an anti-oxidation mask of a nitride film while the mask is covered by a photoresist. Therefore, an acceleration energy of the impurity ion can be set optimally in a wide selection range, because the impurity ion can be blocked by the photoresist to avoid impurity contamination of a device region under the mask of the nitride film. Accordingly, the thickness of the anti-oxidation nitride film can be optimally set to thereby suppress a shortening effect of the channel by reducing a bird's beak length of the device isolation region, thereby contributing to higher density integration of the semiconductor device.

(8) For the same reason as noted above, freedom is increased in setting a depth profile of the impurity density in the device isolation region, thereby achieving the micronization of the device isolation region and the leveling thereof to contribute to higher density integration of the semiconductor device.

What is claimed is:

1. A method of producing a semiconductor device having both a low voltage MOSFET and a high voltage MOSFET formed on a semiconductor substrate, comprising the steps of:
providing a semiconductor substrate of a first conductivity type;
forming an anti-oxidation film over the semiconductor substrate;
forming a first resist film over the anti-oxidation film except for a first area;
removing the anti-oxidation film from the first area;
introducing a first conductivity type impurity into the semiconductor substrate to form an isolation region to isolate high and low voltage MOSFETs to be formed on the semiconductor substrate;
forming a second resist film over the anti-oxidation film except for a second area;
removing the anti-oxidation film from the second area;
introducing a second conductivity type impurity into the semiconductor substrate to form a lightly doped source region and a lightly doped drain region of the high voltage MOSFET;
oxidizing the semiconductor substrate to form an oxide film both on the first area to produce an isolation area and on the second area to produce an insulator film on the lightly doped source region and the lightly doped drain region;
removing the remaining anti-oxidation film from the semiconductor substrate;
forming a gate oxide film and gate electrodes on both a portion of the low voltage MOSFET and a portion between the lightly doped source region and the lightly doped drain region of the high voltage MOSFET; and
introducing selectively a second conductivity type impurity into the semiconductor substrate to form a source region and a drain region of the low voltage MOSFET and to form a heavily doped source region and a heavily doped drain region of the high voltage MOSFET.

2. A method of producing a semiconductor device, comprising the steps of:
providing a semiconductor substrate having transistors of different conductivity types;
forming a solid film over the transistors and the semiconductor substrate;
forming a first resist film over the entire solid film except for a region which corresponds to a first area of the semiconductor substrate;
removing the solid film selectively from the first area;
introducing a first impurity into the semiconductor substrate within the first area to form a first contact region of a first conductivity type for electrical contact with one of said transistors;
forming a second resist film over the entire solid film except for a region which corresponds to a second area of the semiconductor substrate while covering the first area; and
introducing a second impurity into the semiconductor substrate within the second area to form a second contact region of a second conductivity type for electrical contact with another one of said transistors.

3. A method of producing a semiconductor device according to claim 2; further comprising the step of removing the first resist film before forming the second resist film.

4. A method of producing a semiconductor device, comprising the steps of:
providing a semiconductor substrate having a first transistor and a second transistor;
forming a solid film over the semiconductor substrate covering the first transistor and the second transistor;
forming a first resist film over the entire solid film except for a region which corresponds to a first area of the semiconductor substrate;
removing the solid film from the first area;
introducing a first impurity into the semiconductor substrate at the first area to lower an electrical resistance within the first area to form a first contact region for electrical connection with the first transistor;

forming a second resist film over the entire solid film except for a region which corresponds to a second area of the semiconductor substrate while covering the first area;

removing the solid film from the second area; and introducing a second impurity into the semiconductor substrate at the second area to lower an electrical resistance within the second area to form a second contact region for electrical connection with the second transistor.

5. A method of producing a semiconductor device according to claim 4; further comprising the step of removing the first resist film before forming the second resist film.

6. A method of producing a semiconductor device according to claim 4; wherein the first transistor has a source region and a drain region of a first conductivity type and the second transistor has a source region and a drain region of a second conductivity type; the first area comprises at least a portion of the source region and at least a portion of the drain region of the first transistor; the first impurity is introduced into the semiconductor substrate to form the first contact region having the first conductivity type at said portion of the source region and said portion of the drain region of the first transistor; the second area comprises at least a portion of the source region and at least a portion of the drain region of the second transistor; and the second impurity is introduced into the semiconductor substrate to form the second contact region having the second conductivity type at said portion of the source region and said portion of the drain region of the second transistor.

7. A method of producing a semiconductor device according to claim 6; further comprising the step of removing the first resist film before forming the second resist film.

* * * * *